United States Patent
Basceri et al.

(10) Patent No.: US 7,442,977 B2
(45) Date of Patent: Oct. 28, 2008

(54) GATED FIELD EFFECT DEVICES

(75) Inventors: Cem Basceri, Reston, VA (US); H. Montgomery Manning, Eagle, ID (US); Gurtej S. Sandhu, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/253,461

(22) Filed: Oct. 19, 2005

(65) Prior Publication Data

US 2006/0038244 A1 Feb. 23, 2006

Related U.S. Application Data

(62) Division of application No. 10/861,744, filed on Jun. 4, 2004, now Pat. No. 7,161,203.

(51) Int. Cl.
*H01L 27/108* (2006.01)
(52) U.S. Cl. .................. 257/296; 257/321; 257/324; 257/406; 257/E29.303
(58) Field of Classification Search .................. 257/296, 257/321, 324, 406, E29.303
See application file for complete search history.

(56) References Cited

U.S. PATENT DOCUMENTS

| | | | |
|---|---|---|---|
| 4,814,842 A | 3/1989 | Nakagawa et al. | |
| 4,994,888 A | 2/1991 | Taguchi et al. | |
| H000986 H | 11/1991 | Codella et al. | |
| 5,124,272 A | 6/1992 | Saito et al. | |
| 5,352,618 A | 10/1994 | Larsen et al. | |
| 5,498,290 A | 3/1996 | Matossian et al. | |
| 5,554,876 A * | 9/1996 | Kusunoki et al. | ........... 257/411 |
| 5,561,072 A | 10/1996 | Saito | |
| 5,739,066 A | 4/1998 | Pan | |
| 5,759,899 A | 6/1998 | Saito | |
| 6,114,735 A | 9/2000 | Batra et al. | |
| 6,225,669 B1 | 5/2001 | Long et al. | |
| 6,255,165 B1 | 7/2001 | Thurgate et al. | |
| 6,291,865 B1 | 9/2001 | Lee | |
| 6,297,106 B1 | 10/2001 | Pan et al. | |
| 6,348,385 B1 | 2/2002 | Cha et al. | |
| 6,417,085 B1 | 7/2002 | Batra et al. | |
| 6,495,474 B1 | 12/2002 | Rafferty et al. | |

(Continued)

FOREIGN PATENT DOCUMENTS

EP 0507567 A2 7/1992

(Continued)

*Primary Examiner*—Evan Pert
*Assistant Examiner*—Tan N Tran
(74) *Attorney, Agent, or Firm*—Wells St. John P.S.

(57) ABSTRACT

This invention includes gated field effect devices, and methods of forming gated field effect devices. In one implementation, a gated field effect device includes a pair of source/drain regions having a channel region therebetween. A gate is received proximate the channel region between the source/drain regions. The gate has a gate width between the source/drain regions. A gate dielectric is received intermediate the channel region and the gate. The gate dielectric has at least two different regions along the width of the gate. The different regions are characterized by different materials which are effective to define the two different regions to have different dielectric constants k. Other aspects and implementations are contemplated.

20 Claims, 9 Drawing Sheets

U.S. PATENT DOCUMENTS

| | | |
|---|---|---|
| 6,495,890 B1 | 12/2002 | Ono |
| 6,514,808 B1 | 2/2003 | Samavedam et al. |
| 6,563,183 B1 | 5/2003 | En et al. |
| 6,586,808 B1 | 7/2003 | Xiang et al. |
| 6,632,714 B2 | 10/2003 | Yoshikawa |
| 6,657,267 B1 | 12/2003 | Xiang et al. |
| 2001/0017390 A1 | 8/2001 | Long et al. |
| 2001/0038123 A1 | 11/2001 | Yu |
| 2002/0135030 A1 | 9/2002 | Horikawa |
| 2002/0153579 A1 | 10/2002 | Yamamoto |
| 2002/0163039 A1 | 11/2002 | Clevenger et al. |
| 2003/0092238 A1 | 5/2003 | Eriguchi |
| 2004/0180482 A1* | 9/2004 | Noda ............ 438/197 |
| 2004/0185608 A1 | 9/2004 | Oh et al. |
| 2005/0224897 A1* | 10/2005 | Chen et al. ............ 257/410 |

FOREIGN PATENT DOCUMENTS

| | | |
|---|---|---|
| EP | 0507667 A2 | 7/1992 |
| EP | 1067597 A | 1/2001 |
| EP | 1089344 A1 | 4/2001 |
| EP | 1271632 A | 1/2003 |
| JP | 1996181309 | 7/1996 |
| WO | WO PCT/US05/19009 | 2/2008 |

* cited by examiner

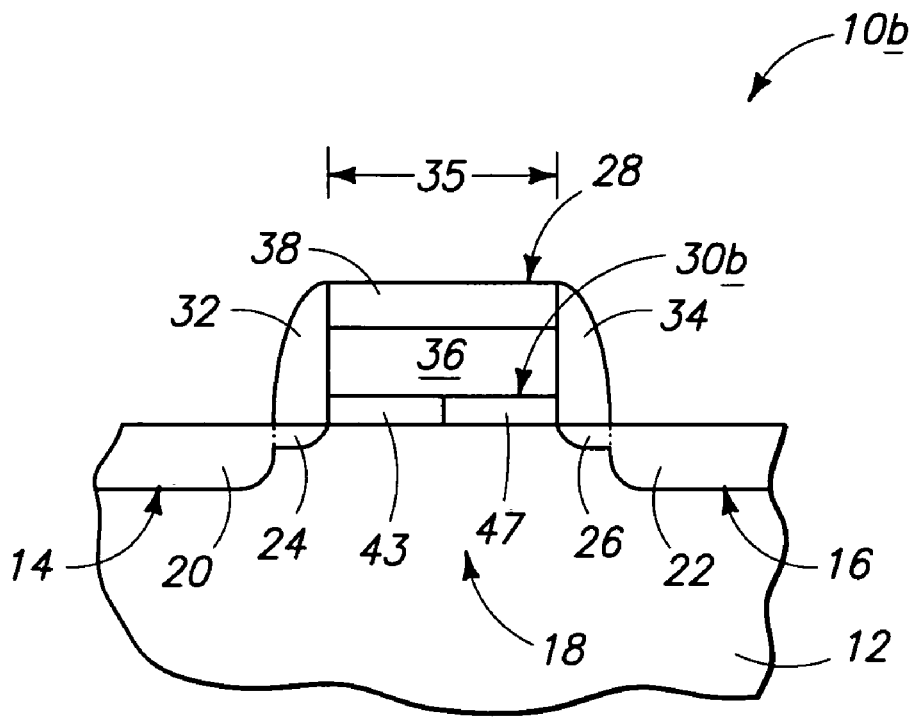
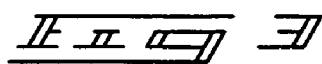
FIG. 3
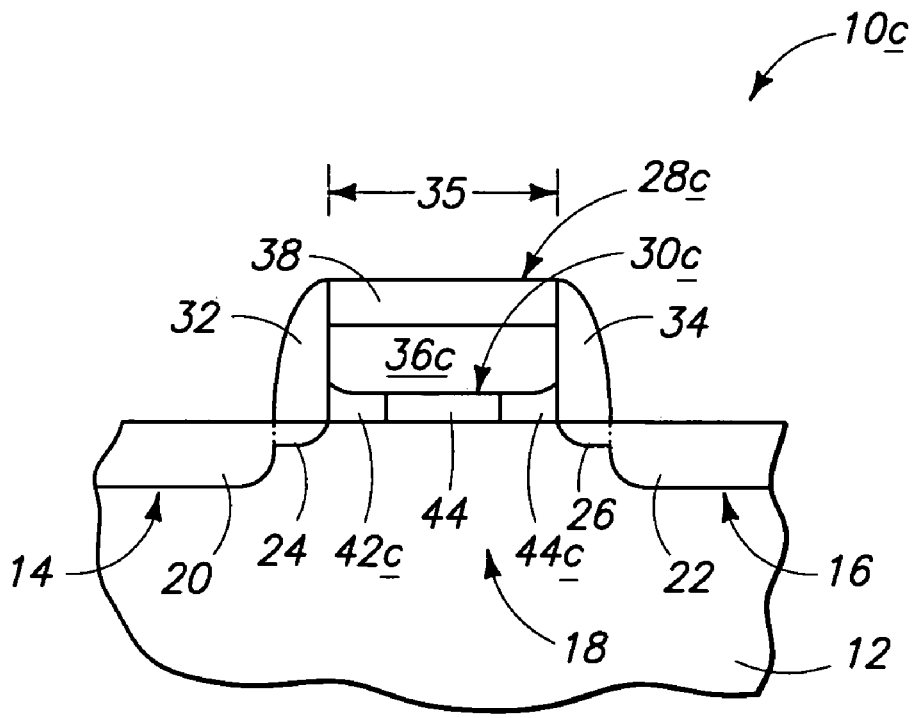
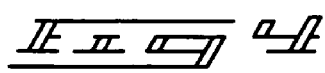
FIG. 4

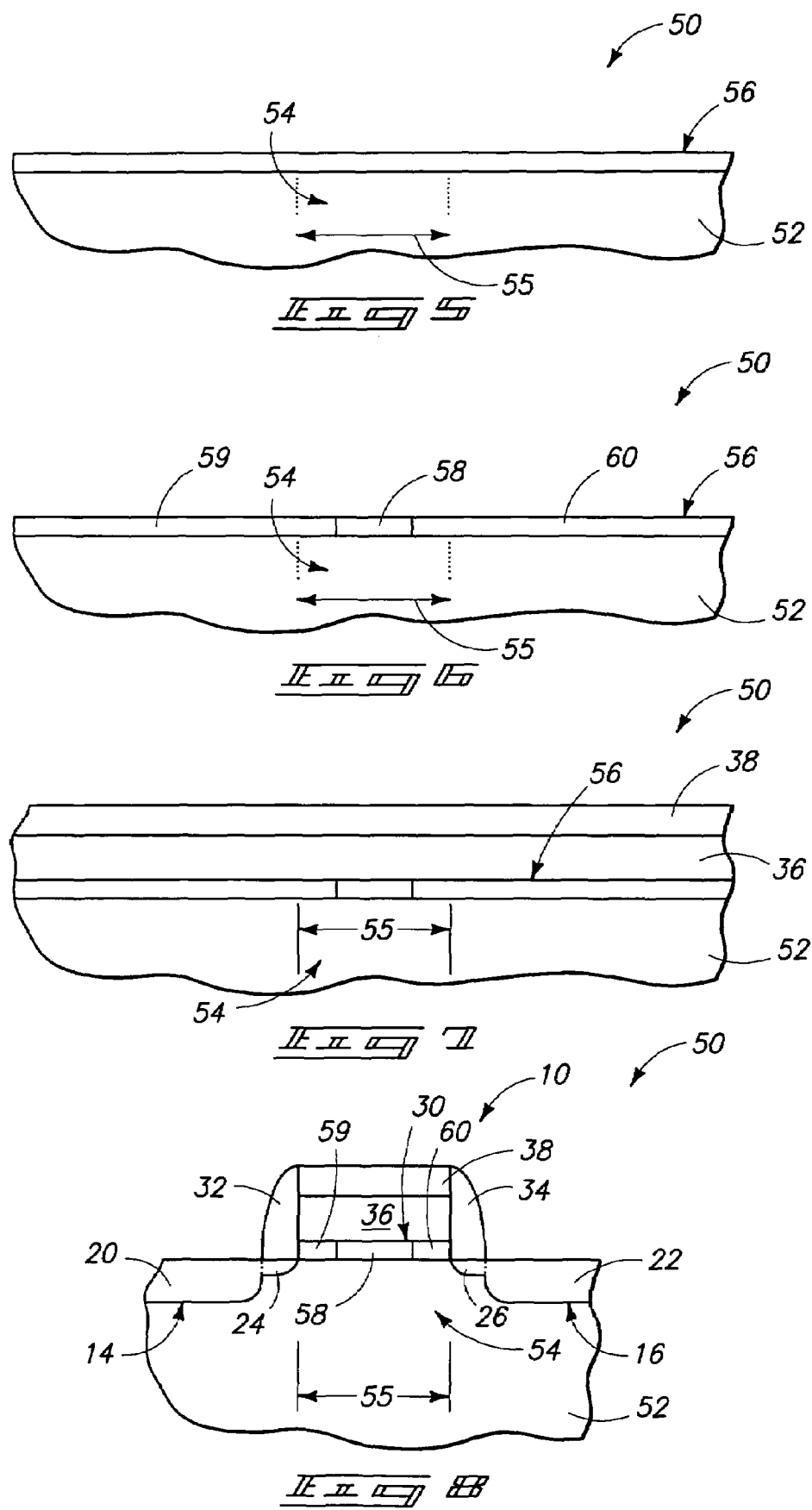

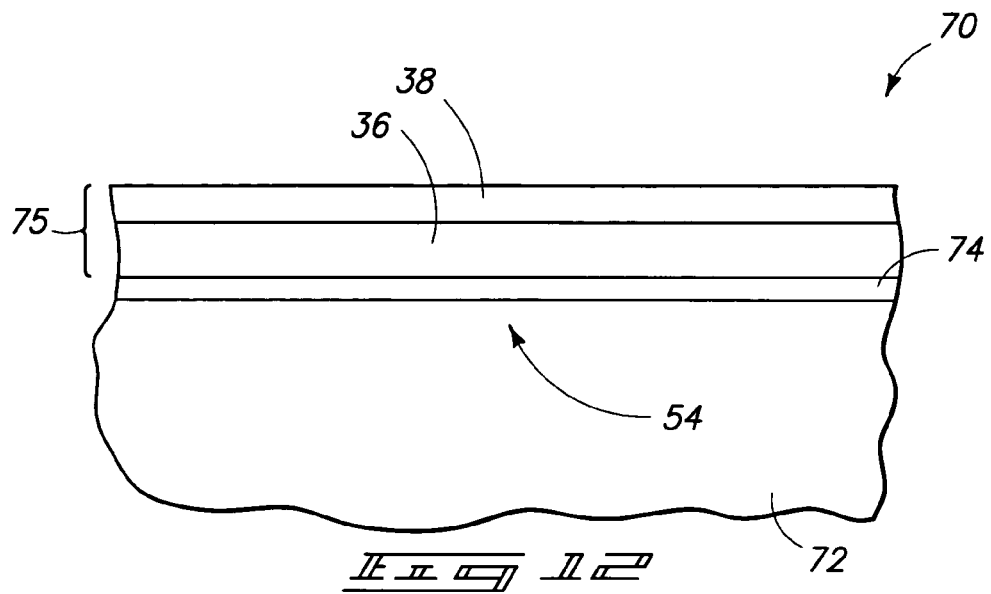
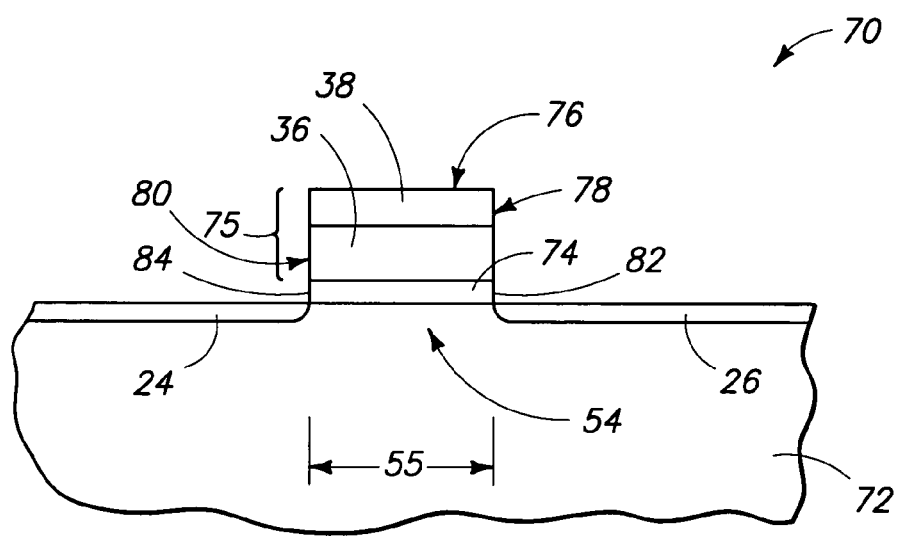
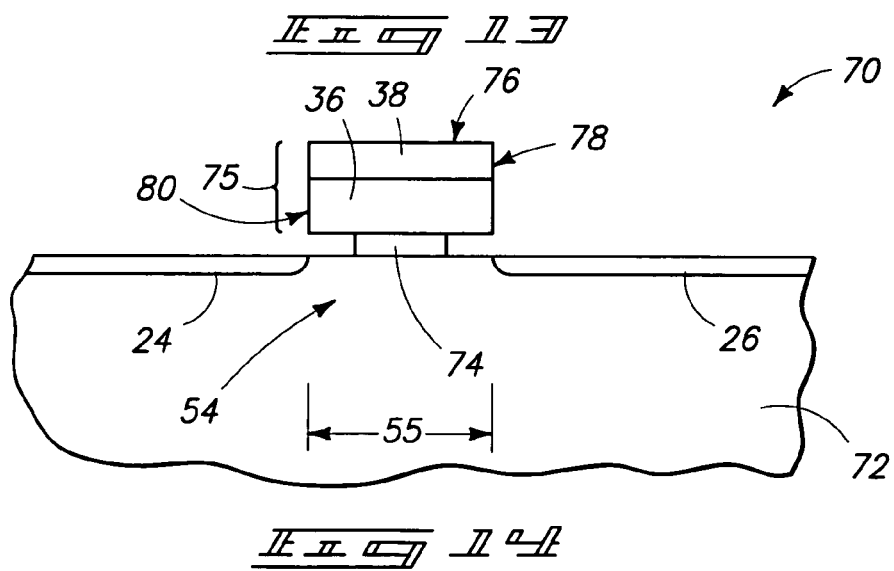

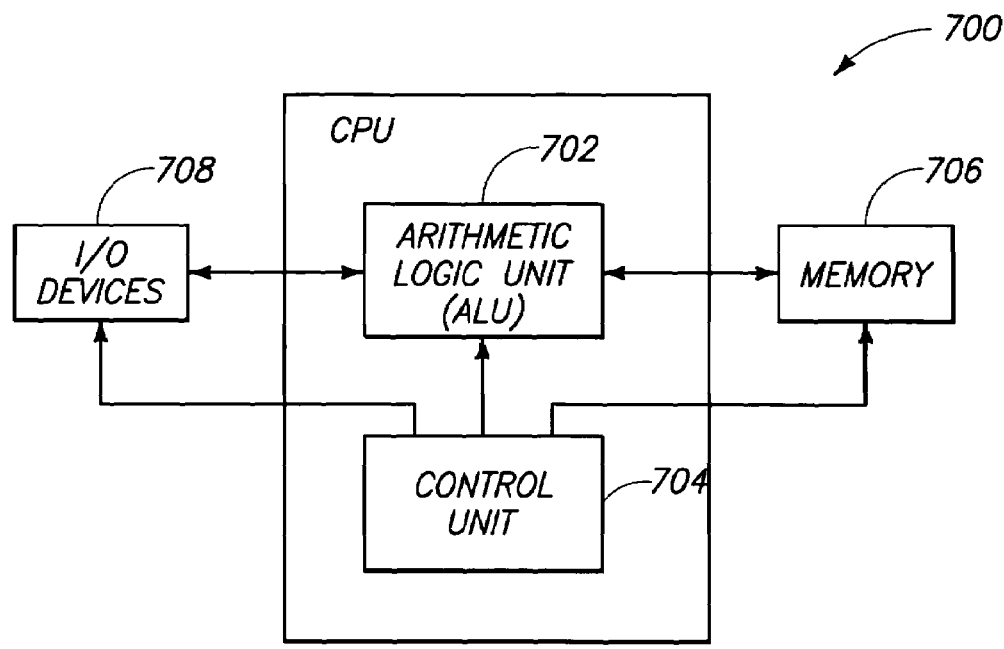
_Fig. 22_
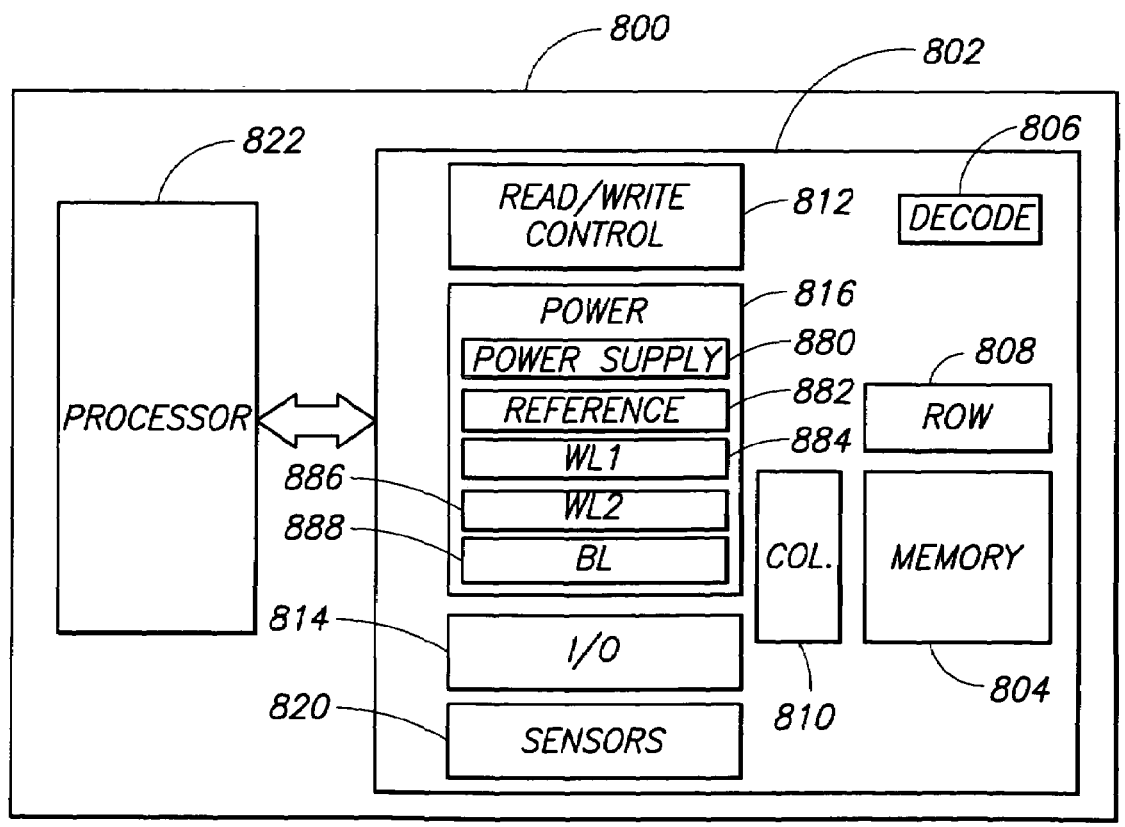
_Fig. 23_

GATED FIELD EFFECT DEVICES

RELATED PATENT DATA

This patent resulted from a divisional application of U.S. patent application Ser. No. 10/861,744, filed Jun. 4, 2004, now U.S. Pat. No. 7,161,203, entitled "Gated Field Effect Devices", naming Cem Basceri, H. Montgomery Manning, Gurtej S. Sandhu and Kunal R. Parekh as inventors, the disclosure of which is incorporated by reference.

TECHNICAL FIELD

This invention relates to gated field effect devices, and to methods of forming gated field effect devices.

BACKGROUND OF THE INVENTION

Gated field effect devices, such as transistors, are utilized in integrated circuitry, such as logic circuitry and memory circuitry. Exemplary memory includes static random access memory (SRAM), dynamic random access memory (DRAM) and floating gate programmable read-only memories (i.e., PROMs, EPROMs and EEPROMs). In a gated field effect device, a conductive gate is received proximate a channel region typically formed in lightly doped semiconductive material. Source/drain regions are received on opposing sides of the channel region. Upon application of a suitable threshold voltage to the gate, an electric field is created in the channel region, enabling or causing current to flow through the channel region from the source region to the drain region. Alternately by way of example only, field effect devices have also been utilized to establish fields beneath conductive gates for creating isolation between circuitry components within a semiconductive substrate.

Field effect devices include at least one conductive gate region and at least one gate dielectric region interposed between the conductive gate region and the semiconductive channel region. A common and predominantly used gate dielectric material has been $SiO_2$. Yet, continued increase in circuit density and reduction in size of field effect device gate constructions have reached the point where the thickness of silicon dioxide gate dielectric layers has become so small that leakage currents, reliability and defects have become problematic. Accordingly, alternate materials have been utilized, for example insulative metal oxides.

Regardless, the substrates after gate fabrication are typically subjected to a reoxidation step which oxidizes a portion of the gate immediately adjacent the dielectric surface at the outer edges of the conductive gate material. Such effectively creates a so-called "smiling gate" structure in which tiny bird's beak structures are formed at the bottom corners of the gate stack. Such reoxidation can help to repair damage to dielectric and silicon surfaces resulting from the anisotropic etch typically utilized to form the gate stack and, as well, reduces hot electron degradation in the device in operation. An effect is to increase the thickness of the gate dielectric at the gate edges as opposed to the center of the gate. This has the apparent effect of lowering the electric field within the semiconductive material of the substrate at the source/drain edges, thereby reducing hot electron degradation.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY OF THE INVENTION

The invention includes gated field effect devices, and methods of forming gated field effect devices. In one implementation, a gated field effect device includes a pair of source/drain regions having a channel region therebetween. A gate is received proximate the channel region between the source/drain regions. The gate has a gate width between the source/drain regions. A gate dielectric is received intermediate the channel region and the gate. The gate dielectric has at least two different regions along the width of the gate. The different regions are characterized by different materials which are effective to define the two different regions to have different dielectric constants k.

In one implementation, a method of forming a gated device includes depositing a first metal containing gate dielectric over one of a gate region or a channel region. The gate region or channel region has a width over which the first metal containing gate dielectric is deposited. A width portion of the metal containing gate dielectric overlying the one of the gate region or the channel region is doped with a second metal different from the first metal effective to form at least two different gate dielectric regions along the width characterized by different materials effective to define the two different gate dielectric regions to have different dielectric constants k. The other portion of the gate region or the channel region is provided over the gate dielectric. A pair of source/drain regions is provided proximate the channel region.

In one implementation, A method of forming a gated device includes depositing a first gate dielectric material over a channel region of a semiconductor substrate. A conductive gate material is formed over the first gate dielectric material. The conductive gate material is patterned effective to form a gate over the first gate dielectric material. The gate comprises opposing sides defining a gate width therebetween. The first gate dielectric material is isotropically etched from at least one side of the gate effective to recess the first gate dielectric material on the at least one side to under the gate. After the isotropically etching, a second gate dielectric material different from the first gate dielectric material is deposited to within the recess beneath the gate. The second gate dielectric material has a different dielectric constant k than that of the first gate dielectric material. A pair of source/drain regions is provided proximate the channel region.

In one implementation, a method of forming a gated device includes providing a substrate comprising one of a gate region or a channel region. The gate region or channel region comprises a width. A first portion of the width of the one of the gate region or the channel region is masked while depositing a first gate dielectric material over a second portion of the width of the one of the gate region or the channel region. The second portion of the width of the one of the gate region or the channel region is masked while depositing a second gate dielectric material different from the first gate dielectric material over the first portion of the width of the one of the gate region or the channel region. The first and second gate dielectric materials are characterized by different dielectric constants k. The other of the gate region or the channel region is provided over the first and second gate dielectric materials. A pair of source/drain regions is provided proximate the channel region.

Other aspects and implementations are contemplated.

BRIEF DESCRIPTION OF THE DRAWINGS

Preferred embodiments of the invention are described below with reference to the following accompanying drawings.

FIG. 3 is a diagrammatic sectional view of another device in accordance with an aspect of the invention.

FIG. 4 is a diagrammatic sectional view of another device in accordance with an aspect of the invention.

FIG. 5 is a diagrammatic sectional view of a substrate fragment in process in accordance with an aspect of the invention.

FIG. 6 is a view of the FIG. 5 substrate fragment at a processing subsequent to that depicted by FIG. 5.

FIG. 7 is a view of the FIG. 6 substrate fragment at a processing subsequent to that depicted by FIG. 6.

FIG. 8 is a view of the FIG. 7 substrate fragment at a processing subsequent to that depicted by FIG. 7.

FIG. 12 is a diagrammatic sectional view of another substrate fragment in process in accordance with an aspect of the invention.

FIG. 13 is a view of the FIG. 12 substrate fragment at a processing subsequent to that depicted by FIG. 12.

FIG. 14 is a view of the FIG. 13 substrate fragment at a processing subsequent to that depicted by FIG. 13.

FIG. 22 shows a high level block diagram of an electronic system according to an exemplary aspect of the present invention.

FIG. 23 shows a simplified block diagram of an exemplary device according to an aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
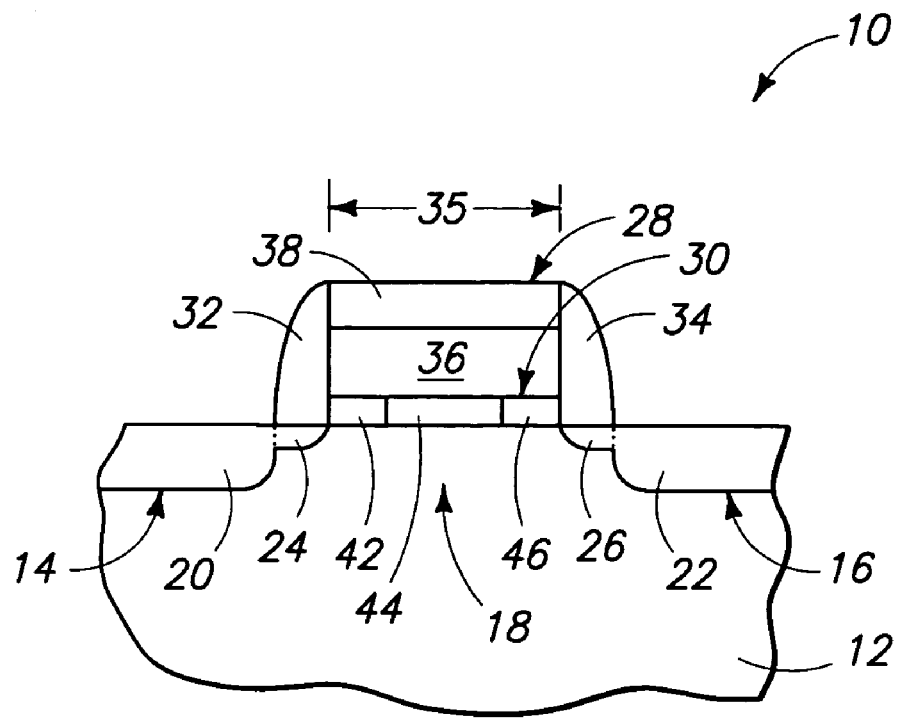
FIG. 1 is a diagrammatic sectional view of a device in accordance with an aspect of the invention.

A first embodiment gated field effect device is indicated generally in FIG. 1 with reference numeral 10. Such is depicted as being formed relative to a base substrate 12, for example bulk monocrystalline silicon. Alternate substrates are contemplated, including semiconductor substrates, for example semiconductor-on-insulator substrates or other substrates, and whether existing or yet-to-be developed. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A pair of source/drain regions 14, 16 is formed within substrate 12, and a channel region 18 is received therebetween. Source/drain regions 14, 16 comprise highest conductivity doped regions 20 and 22, respectively, and lightly doped drain regions 24 and 26, respectively. Additional regions, for example halo implant regions, could of course be utilized, as well as any other source/drain region or component thereof whether existing or yet-to-be developed. For example and by way of example only, the source/drain regions might be fabricated to include or consist of materials other than conductively doped semiconductive material, be formed in semiconductor-on-insulator layers, be fabricated to comprise elevated source/drain regions, etc. Alternate channel regions and other configurations are also of course contemplated.

Gated field effective device 10 comprises a gate 28 received proximate channel region 18 between source/drain regions 14, 16. A gate dielectric 30 is received intermediate channel region 18 and gate 28. In the depicted preferred embodiment, gate 28 is shown as comprising two conductive material layers 36 and 38. Exemplary thicknesses for layers 36 and 38 are 500 Angstroms and 400 Angstroms, respectively. By way of example only, an exemplary material for conductive layer/region 36 is conductively doped polysilicon, and an exemplary material 38 is one that is of higher conductivity than material 36, with tungsten or tungsten silicide being but two examples. Gate 28 comprises or defines a gate width 35 between source drain regions 14, 16. Exemplary optional and preferred insulative sidewall spacers 32 and 34 have been formed by anisotropic etching about sidewalls of gate 28. By way of example only, preferred materials include silicon dioxide and silicon nitride.

Gate dielectric 30 comprises at least two different regions along width 35 of gate 28. The different regions are characterized by different materials effective to define such two different regions to have different dielectric constants k. In the depicted exemplary and preferred embodiment, gate dielectric 30 comprises at least three, and only three, different regions 42, 44 and 46. Further in one preferred embodiment, region 44 comprises a central region which is laterally centered along width 35 of gate 28, with regions 42 and 46 comprising a pair of regions received adjacent to and straddling central region 44. In one preferred embodiment, central region 44 is of a different material than either of straddling regions 42 and 46 effective to define central region 44 to have a different dielectric constant k than that of either of straddling regions 42 and 46. In one preferred embodiment, straddling regions 42 and 46 comprise from 10% to 25% of width 35 of gate 28.

In one preferred embodiment, different regions 42, 44 and 46 are respectively characterized by a uniform dielectric constant k thereacross in a direction along width 35 of gate 28. In one exemplary alternate embodiment, at least one of the different regions of the gate dielectric is characterized by variable dielectric constant k across the one region in a direction along the width of the gate. In one exemplary embodiment, each of straddling regions 42 and 46 is of higher dielectric constant k than that of central region 44. In an alternate embodiment, each of straddling regions 42 and 46 is of lower dielectric constant k than that of central region 44. In one exemplary embodiment, straddling regions 42 and 46 are of the same composition material and dielectric constant k. Accordingly by way of example only in such instance, gate dielectric 30 is characterized by at least three different regions along width 35 of gate 28 further characterized by two different dielectric constant materials preferably having uniform dielectric constant k thereacross in a direction along width 35 of gate 28. In the depicted preferred embodiment, regions 42 and 46 are received proximate source/drain regions 14, 16, respectively, and also as shown, preferably extend to source/drain regions 14, 16, respectively. In one preferred embodiment, straddling regions 42 and 46 are of different composition material and dielectric constant k.

In one preferred embodiment, at least one of the different gate dielectric regions is characterized by a uniform dielectric constant k thereacross in a direction along the width of the gate which spans at least 50% of the width of the gate. In the illustrated exemplary FIG. 1 embodiment, central region 44 constitutes but one such exemplary region.

As described in the "Background" section above, source/drain reoxidation tends to thicken the gate dielectric by forming gate oxide regions at the source/drain edges of the gate, leaving the central portion of the gate dielectric over the channel region at the as-grown thickness. In the current state of the art, an advantageous effect of such results in lowering the electric field at the source/drain regions, thereby reducing hot carrier effects and increasing device lifetimes. An alternative, or addition thereto, would be to lower the dielectric constant of the gate dielectric at the source/drain edges by varying gate dielectric composition to provide an effectively thicker gate dielectric at the gate edges even though the physical thickness of the gate dielectric may be unchanged. Such could have the same effect of lowering the electric field at the source/drain edges. Alternately if desired, dielectric constant by material modification could be utilized to raise the dielectric constant at the source/drain edges, or elsewhere along some portion of the gate width.

Increasing or decreasing the dielectric constant can be accomplished by providing the different composition material regions by, for example only, doping desired regions of the gate dielectric material. For example in one implementation, consider that a hafnium oxide gate dielectric can be doped with elemental aluminum such that the effective dielectric constant is reduced from that of pure hafnium oxide. Alternately by way of example only, an aluminum oxide gate dielectric can be doped with elemental hafnium for increasing the effective dielectric constant from that of aluminum oxide alone. By way of example only, additional examples include doping tantalum oxide with niobium to result in an increase of k over that of pure tantalum oxide, silicon doping of hafnium oxide to reduce k from that over pure hafnium oxide, and zirconium doping of barium strontium titanate to result in lower k than that over pure barium strontium titanate. Of course, any dopant might be isovalent, acceptor-type or donor-type, and depending on the desire and modification of the effective dielectric constant.

In accordance with one implementation, the different gate dielectric materials for the different material regions comprise oxides. In one implementation, the different oxides comprise $Hf_xAl_yO_z$, where "z" is greater than zero, and "x" and "y" range from 0 to 1 with at least one of "x" and "y" being greater than zero. In one exemplary implementation, the different oxides comprise $Ta_xNb_yO_z$, where "z" is greater than zero, and "x" and "y" range from 0 to 1 with at least one of "x" and "y" being greater than zero. In one implementation, the different oxides comprise $Hf_xSi_yO_z$, where "z" is greater than zero, and "x" and "y" range from 0 to 1 with at least one of "x" and "y" being greater than zero. In one implementation, the different oxides comprise $Ba_xSr_yTi_zO_3$, where "x", "y" and "z" range from 0 to 1 with at least one of "x", "y" and "z" being greater than zero. In one implementation, the different oxides comprise $ZrO_x$, where x ranges from 1 to 2.

Figure 2:
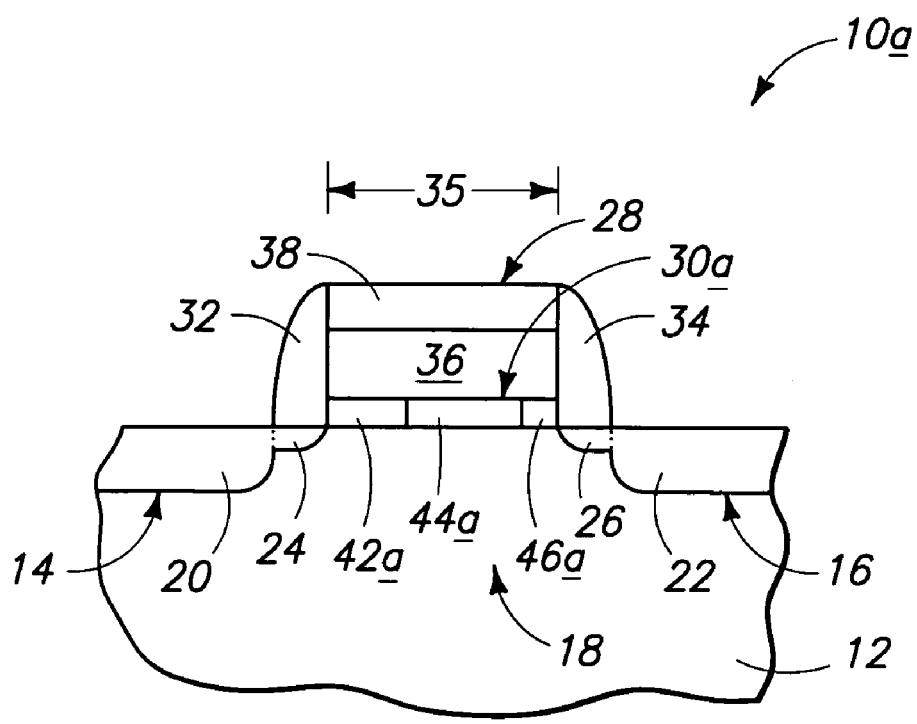
FIG. 2 is a diagrammatic sectional view of another device in accordance with an aspect of the invention.

FIG. 1 depicts an example wherein one different material region 44 is centered laterally between a pair of different composition regions 42 and 46 relative to gate 28. By way of example only, FIG. 2 provides an alternate example embodiment gated field effect device 10a. Like numerals from the first-described embodiment are utilized where appropriate, with differences being indicated with the suffix "a". Here, a region 44a is depicted as not being centered laterally between a pair of regions 42a and 46a. Of course, alternate embodiments are contemplated having different sizes and orientations for the depicted regions, including more or fewer of the illustrated three regions. Further and by way of example only, FIG. 3 depicts an alternate embodiment gated field effect device 10b. Like numerals from the first-described embodiment are utilized where appropriate, with differences being indicated with the suffix "b", or with different numerals. Here, gate dielectric 30b is comprised of only two different regions 43 and 47 characterized by different materials effective to define two different regions having different dielectric constants k. FIG. 3 depicts regions 43 and 47 as being of the same width along width dimension 35 off gate 28, although such regions could of course be of different widths.

The above-depicted exemplary embodiments illustrate the respective gate dielectrics being of constant thickness along the width of the respective gates. By way of example only, a preferred thickness range for gate dielectrics 30, 30a, and 30b is from 20 Angstroms to 80 Angstroms. Further by way of example only, FIG. 4 depicts an alternate embodiment gated field effect device 10c wherein the gate dielectric is of variable thickness along the width of the gate. Like numerals from the first-described embodiment are utilized where appropriate, with differences being indicated with the suffix "c". Here, gate dielectric 30c depicts different material regions 42c and 44c having been subjected to source/drain re-oxidation such that a conventional thickened region thereof results at the gate edges/sidewalls. Of course, only one of the edges might be thickened or any different variable thickness might be provided along the width of the gate for gate dielectric 30c.

The above-described embodiments depict substantially planar or horizontally-oriented gated field effect devices. Of course, vertical, annular, or any other configuration is contemplated, whether existing or yet-to-be-developed, with the above merely being exemplary preferred embodiments.

Additional aspects of the invention contemplate fabricating various of the above-described and depicted devices, as well as methods of forming gated devices as literally claimed including independent of structural attributes as described above. By way of example only, a first embodiment method of forming a gated device is described with reference to FIGS. 5-8. FIG. 5 depicts a substrate fragment 50 comprising semiconductor material 52, for example bulk monocrystalline silicon. For purposes of the continuing discussion, substrate 52 comprises one of a gate region or a channel region, with a channel region 54 being depicted. Such region 54 may not, and typically will not, be completely defined or perhaps at all defined by lateral or length boundaries at this point in the process. Regardless, the ultimate channel region 54 can be considered as comprising a width 55 which will ultimately be defined for the gated device. A first metal containing gate dielectric 56 is deposited over channel region 54. An exemplary thickness for layer 56 is from 20 Angstroms to 80

Angstroms. Any of the above-described metal and/or silicon oxides are exemplary preferred materials.

Referring to FIG. 6, some width portion 58 of metal containing gate dielectric 56 overlying channel region 54 has been doped with a second metal different from the first metal effective to form at least two different gate dielectric regions 58 and 59, 60 along width 55. Such at least two different gate dielectric regions are characterized by different materials effective to define at least two different of gate dielectric regions 58 and 59, 60 to have different dielectric constants k. Again, any of the above exemplary described materials are preferred. For example and by way of example only, a single metal oxide might initially be deposited, such as hafnium oxide. Any one or more of the depicted width portions 59, 58 and 60 could thereafter be doped with another metal, for example aluminum, such that at least two gate dielectric regions characterized as described are formed. Alternately by way of example only, layer 56 might be deposited to comprise multiple metals beyond a first metal, with some width portion of the metal containing gate dielectric 56 overlying channel region 54 being doped with one of the existing or additional metals of a multiple metal containing dielectric layer. Accordingly, the "second" metal might also be incorporated in the gate dielectric as initially deposited. Further of course, more than two metals might be utilized. Preferred doping to produce the described at least two different material regions might be by any of ion implantation, gas phase diffusion, plasma phase diffusion or any other method, whether existing or yet-to-be developed, and utilizing appropriate masking or directing of the doping metal or metals.

At some point in such a method of forming a gated device, the other of the gate region or the channel region is provided over the gate dielectric, and a pair of source/drain regions are also provided proximate the channel region. FIG. 7 depicts conductive gate layers 36 and 38 having been deposited over gate dielectric 56, with preferred attributes being as described above in connection with the first described embodiment having layers 36 and 38. FIG. 8 depicts subsequent processing thereof to define the depicted gate outline having sidewall spacers, thereby, in this example, producing the exemplary FIG. 1 embodiment gated field effect device 10. Of course, the described method could be utilized to form any of the other FIGS. 2-4, or other, gated field effect devices. Other preferred attributes in the method of fabricating the device as just-described include any of the above-described attributes in the fabrication of the exemplary FIGS. 1-4 embodiments.

Figure 9:
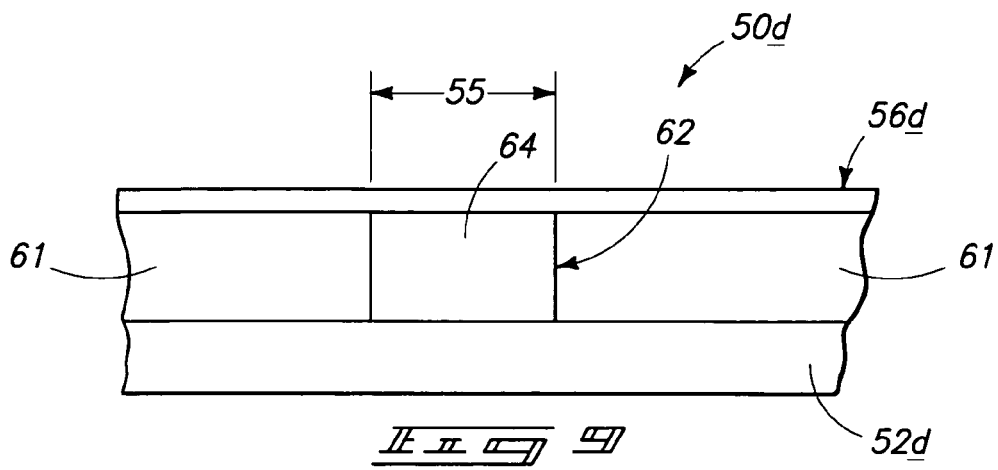
FIG. 9 is a diagrammatic sectional view of another substrate fragment in process in accordance with an aspect of the invention.
Figure 10:
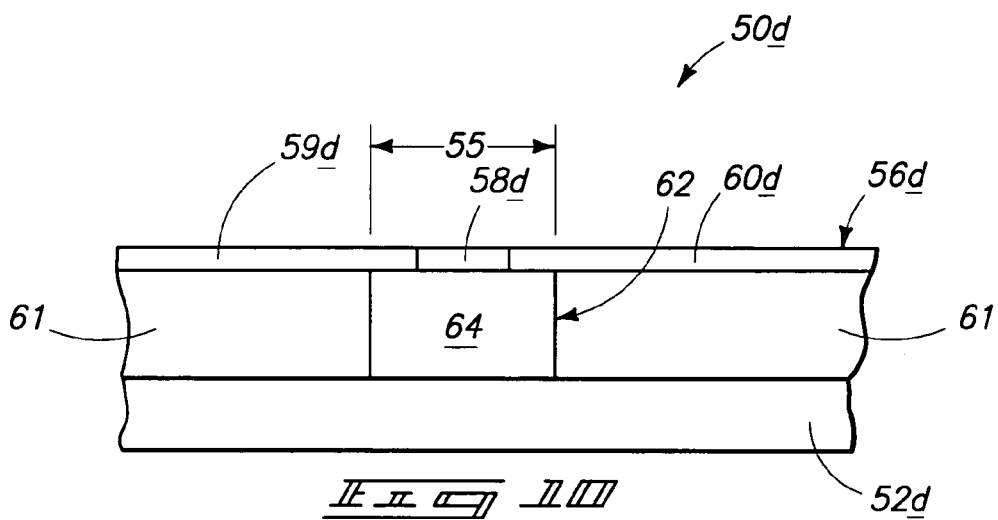
FIG. 10 is a view of the FIG. 9 substrate fragment at a processing subsequent to that depicted by FIG. 9.
Figure 11:
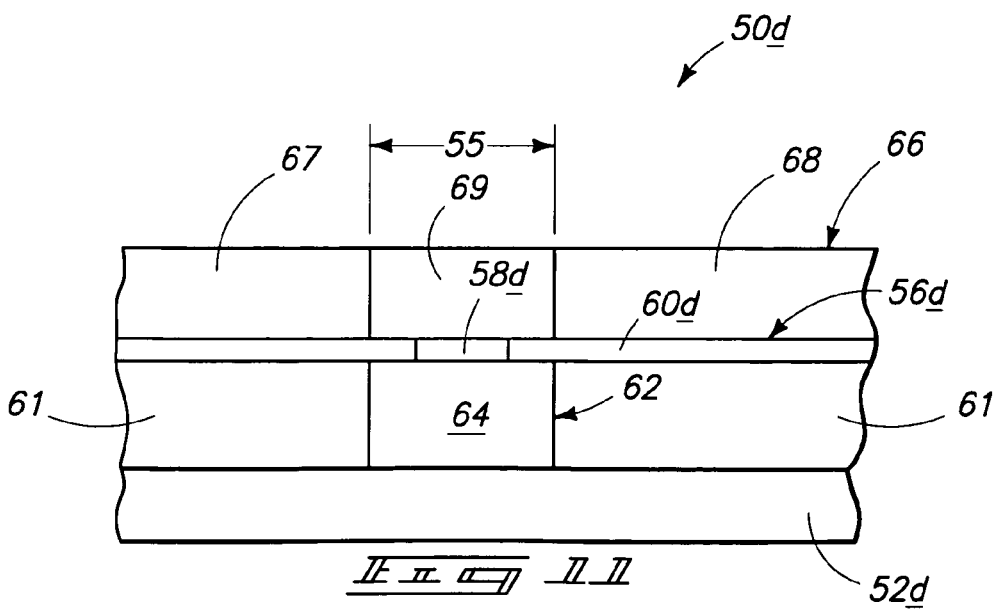
FIG. 11 is a view of the FIG. 10 substrate fragment at a processing subsequent to that depicted by FIG. 10.

FIGS. 5-8 depict an exemplary embodiment wherein the first metal containing gate dielectric is deposited over the channel region. By way of example only, FIGS. 9-11 depict an exemplary alternate embodiment substrate fragment 50d. Like numerals from the first-described embodiment are utilized where appropriate, with differences being indicated with the suffix "d", or with different numerals. Substrate fragment 50d is comprised of a base substrate 52d made up of one or more conductive, semiconductive and/or insulating materials. An insulating layer 61 has been formed thereover. An opening or trough 62 has been provided therein and filled with some suitable conductive gate material 64. In this exemplary embodiment, conductive gate material 64 defines or comprises a suitable gate region having an exemplary width 55. A first metal containing gate dielectric 56d is deposited over gate region 64.

Referring to FIG. 10, at least one of width portions 59d, 58d and 60d of metal containing gate dielectric 56d overlying gate region 64 has been doped with a second metal different from the first metal effective to form the illustrated at least two different gate dielectric regions 58d and 59d, 60d.

Referring to FIG. 11, a semiconductor layer 66 has been deposited. Such has been processed, patterned and otherwise formed to comprise source/drain regions 67 and 68, and a channel region 69 therebetween.

Further by way of example only, another exemplary method of forming a gated device is described with reference to FIGS. 12-16. FIG. 12 depicts a substrate fragment 70 comprising, for example, a bulk semiconductor substrate 72. Substrate 72 comprises a channel region 54, for example as described above in connection with substrate fragment 50 in FIG. 5. A first gate dielectric material 74 has been deposited over channel region 54 of semiconductor substrate 72. Conductive gate material 75 has been formed over first gate dielectric material 74, with exemplary layers 36 and 38 as described above being shown to encompass conductive gate material 75.

Referring to FIG. 13, conductive gate material 75 has been patterned effective to form a gate 76 over first gate dielectric material 74. Gate 76 can be considered as comprising opposing sides 78 and 80 defining a gate width 55 therebetween. In the depicted exemplary preferred embodiment, first gate dielectric material 74 is patterned commensurate with the patterning of conductive gate material 75 effective to form first gate material 74 to comprise opposing sides 82 and 84 which are laterally coincident with gate sides 78 and 80, respectively. However, the invention also contemplates leaving some or all of material 74 over the source/drain regions at this point in the process. In one preferred embodiment, FIG. 13 also depicts the formation of lightly doped drain regions 24 and 26.

Referring to FIG. 14, the first gate dielectric material has been isotropically etched from at least one side of the gate effective to recess the gate dielectric material on the at least one side to under the gate. In the depicted preferred embodiment, isotropic etching of first gate dielectric material 74 has been conducted from both sides 78 and 80 of gate 76 effective to recess first gate dielectric material 74 on both such sides to be received beneath gate 76 within the lateral confines of gate sides 78 and 80. Exemplary preferred isotropic etching includes wet etching. For example, and by way of example only, where gate dielectric material 74 comprises hafnium oxide, layer 38 comprises tungsten or tungsten silicide, and layer 36 comprises doped polysilicon, an exemplary isotropic etching chemistry for hafnium oxide to produce the exemplary construction of FIG. 14 includes wet etching with HF or phosphoric acid, or dry etch with $Cl_2$ based chemistries at elevated temperatures up to 300° C.

Figure 15:
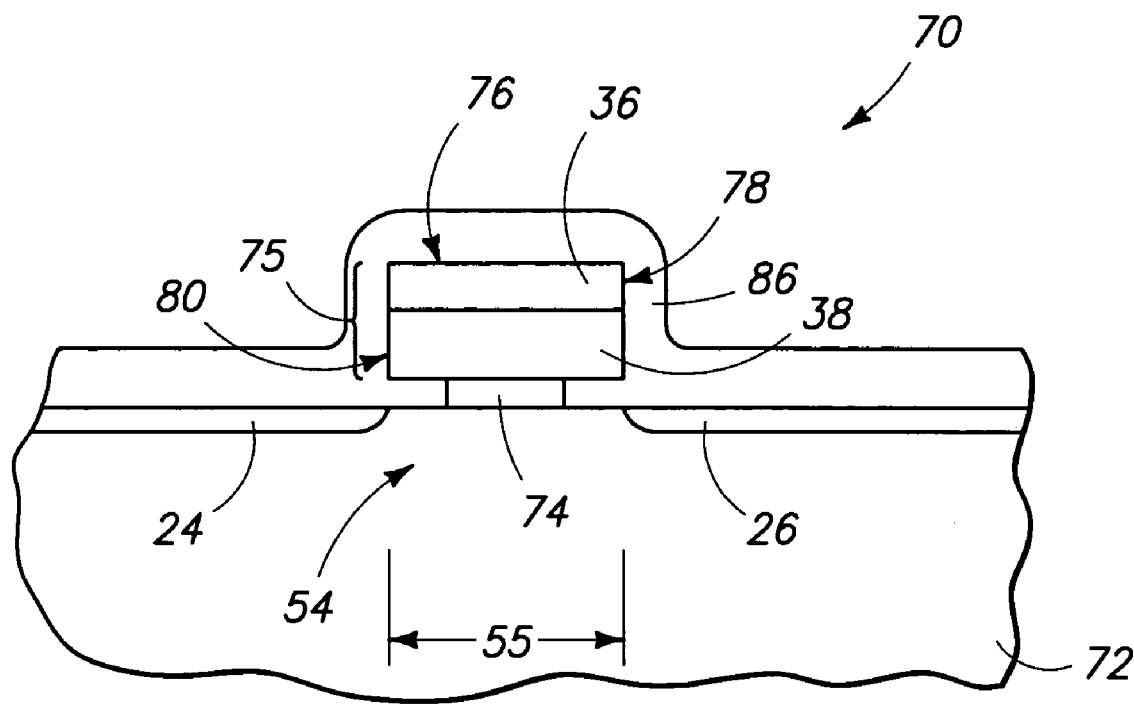
FIG. 15 is a view of the FIG. 14 substrate fragment at a processing subsequent to that depicted by FIG. 14.

Referring to FIG. 15, after the isotropic etching, a second gate dielectric material 86 different from first gate dielectric material 74 has been deposited to within the recesses previously formed beneath gate 76. Second gate dielectric material 86 is characterized as having a different dielectric constant k than that of first gate dielectric material 74. Again, and by way of example only, any of the above-described exemplary preferred materials can be utilized. Exemplary preferred techniques for the deposition include chemical vapor deposition and atomic layer deposition towards achieving the depicted recess filling of FIG. 15.

Figure 16:
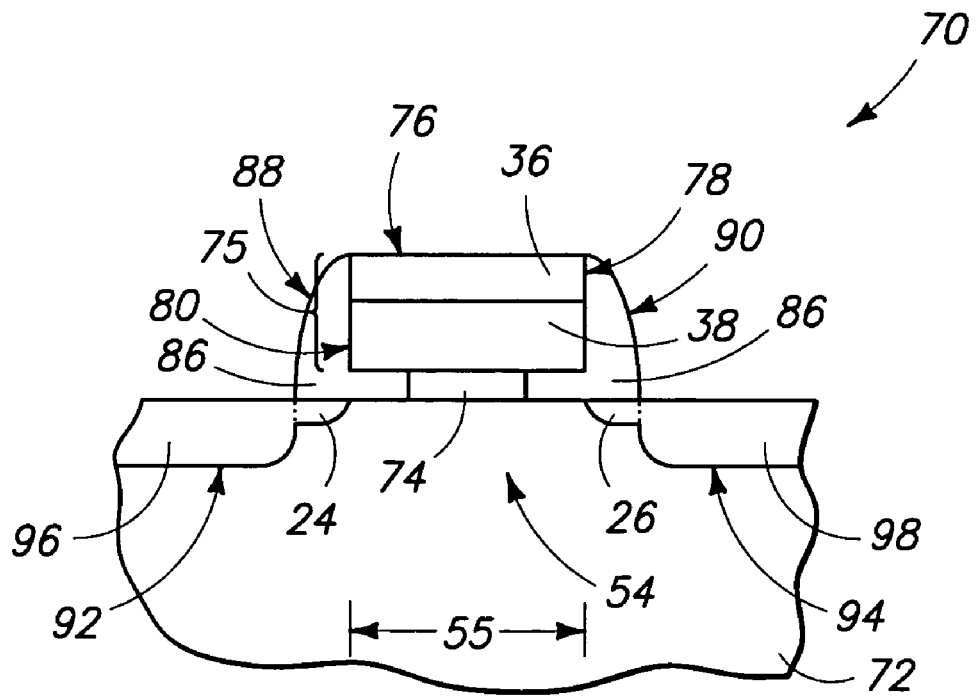
FIG. 16 is a view of the FIG. 15 substrate fragment at a processing subsequent to that depicted by FIG. 15.

Referring to FIG. 16, subsequent processing is depicted whereby, in one preferred embodiment, second gate dielectric material 86 has been anisotropically etched to form insulative field effect device sidewall spacers 88 and 90. Further and ultimately as shown, a pair of source/drain regions 92 and 94 have been formed proximate channel region 54. In the exemplary depicted embodiment, such encompass lightly doped drain regions 24 and 26, respectively, and highest dopant concentration regions 96 and 98, respectively. In the depicted and described exemplary embodiment, the formation of highest dopant concentration regions 96 and 98 of source/drain regions 92 and 94, respectively, is conducted after both of the described isotropic etching of dielectric material 74 and the depositing of second gate dielectric material 86. Processing is, of course, contemplated where the providing of the highest dopant concentration regions of the source/drain regions is provided before one or both of the isotropic etching and depositing of the second gate dielectric material. By way of example only, other attributes are preferably as described above in conjunction with the FIGS. 1-4 embodiments.

Yet another exemplary preferred method of forming a gated device in accordance with aspects of the invention is described with reference to FIGS. 17-19 in conjunction with a semiconductor substrate fragment 100. By way of example only, such comprises a bulk semiconductor substrate, for example monocrystalline silicon. Such comprises one of a gate region or a channel region, with an exemplary channel region 54 being shown having a width 55, for example as described above in connection with FIG. 5. For purposes of the continuing discussion, substrate fragment 100 can be considered as comprising a first portion 104 and a second portion 105. In the depicted FIG. 17 embodiment, first portion 104 comprises a portion of width 55 of channel region 54. Such portion thereof has been masked while depositing a first gate dielectric material 110 over second portion 105 of channel region 54. Exemplary preferred materials are any of those described above in conjunction with the FIG. 1 embodiment. An exemplary preferred technique for masking and depositing material 110 includes depositing material 110, then patterning with photoresist, followed by etching.

Figure 18:
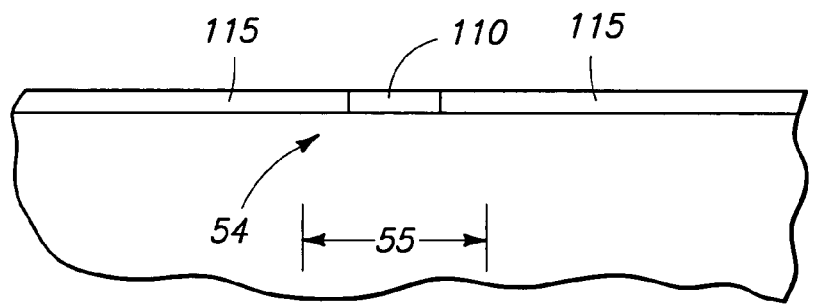
FIG. 18 is a view of the FIG. 17 substrate fragment at a processing subsequent to that depicted by FIG. 17.

Referring to FIG. 18, second portion 105 of width 55 of channel region 54 has been masked while depositing a second gate dielectric material 115, different from first gate dielectric material 110, which is received over first portion 104 of width 55 of channel region 54. The first and second gate dielectric materials 110 and 115 are characterized by different dielectric constants k. Again, exemplary preferred materials are those described above in connection with the FIG. 1 embodiment.

Ultimately, the other of the gate region or the channel region is provided over the first and second gate dielectric materials, and a pair of source/drain regions is provided proximate the channel region. By way of example only, FIG. 19 depicts the fabrication of gated field effect device 10 of the exemplary first described embodiment. Other exemplary preferred attributes are as described above with respect to the FIGS. 1-4 embodiments.

Figure 17:
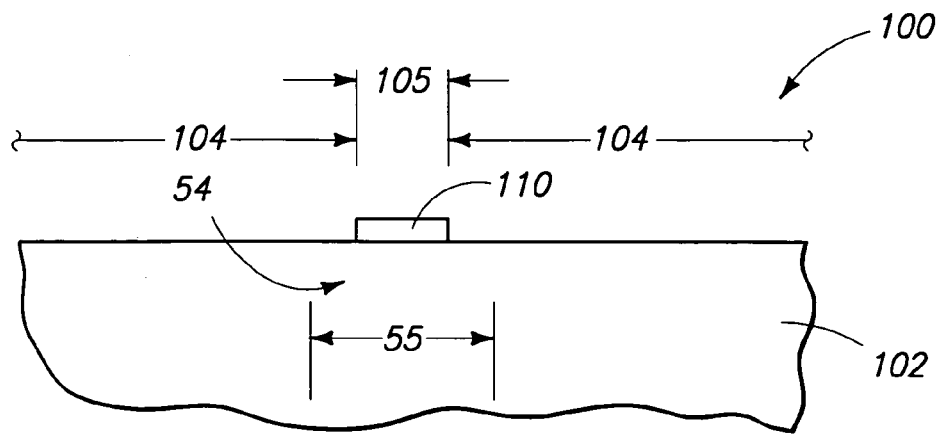
FIG. 17 is a diagrammatic sectional view of another substrate fragment in process in accordance with an aspect of the invention.
Figure 19:
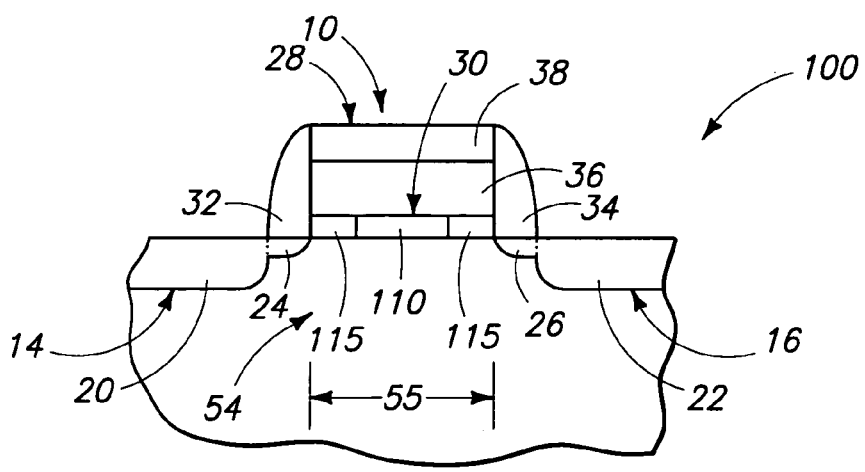
FIG. 19 is a view of the FIG. 18 substrate fragment at a processing subsequent to that depicted by FIG. 18.

FIGS. 17-19 depict that the described maskings of the first and second portions occur over the channel region. Of course, this aspect of the invention also contemplates maskings of the first and second portions occurring over a gate region, for example analogous processing to that depicted and described in conjunction with FIGS. 9-11.

Figure 20:
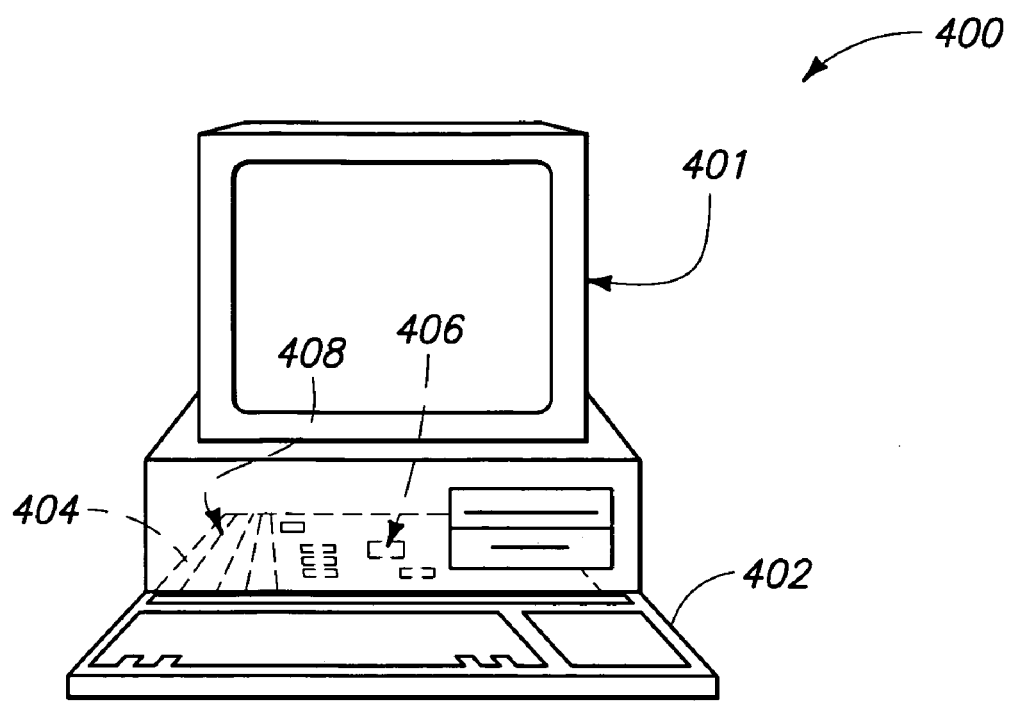
FIG. 20 shows a diagrammatic view of computer illustrating an exemplary application of the present invention.
Figure 21:
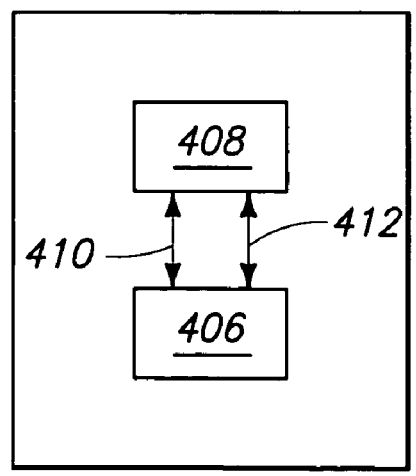
FIG. 21 is a block diagram showing particular features of the motherboard of the FIG. 20 computer.

FIG. 20 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in a block diagram of the motherboard 404 as shown in FIG. 21. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in implementations that utilize the teachings of the present invention. The memory device can be incorporated into any of a variety of designs that provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory that allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

FIG. 22 illustrates a simplified block diagram of a high-level organization of various embodiments of an exemplary electronic system 700 which, by way of example only, can be incorporated with aspects of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM or other memory cells in accordance with various aspects of the present invention.

FIG. 23 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data that is accessed via I/O lines. It will be appreciated by those skilled in the art that additional circuitry and control signals can be provided, and that the memory device 802 has been simplified to help focus on the invention. At least one of the processor 822 or memory device 802 can include a capacitor construction in a memory device of the type described previously herein.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A gated field effect device comprising:
   a pair of source/drain regions having a channel region therebetween;
   a gate proximate the channel region between the source/drain regions, the gate comprising a gate width between the source/drain regions; and
   a gate dielectric received intermediate the channel region and the gate, the gate dielectric comprising at least three regions along the width of the gate, the three regions being characterized by at least two different materials effective to define the three regions to have at least two different dielectric constants k, the three regions comprising a pair of lower dielectric constant k regions received proximate the source/drain regions, with a higher dielectric constant k region being received laterally between the pair, the higher dielectric constant k region not being centered laterally between the pair relative to the gate.

2. The device of claim 1 wherein each of the regions are respectively characterized by a uniform dielectric constant k thereacross in a direction along the width of the gate.

3. The device of claim 1 wherein at least one of the regions is characterized by a variable dielectric constant k across the one region in a direction along the width of the gate.

4. The device of claim 1 comprised by a memory device.

5. The device of claim 4 wherein the memory device is DRAM.

6. The device of claim 4 wherein the memory device is further comprised by a computer system that includes a microprocessor.

7. The device of claim 1 wherein the gate comprises conductive material, the different materials directly contacting the conductive material of the gate.

8. The device of claim 1 wherein the gate dielectric is of constant thickness along the width of the gate.

9. The device of claim 1 wherein the gate dielectric is of variable thickness along the width of the gate.

10. The device of claim 1 wherein the different materials comprise oxides.

11. The device of claim 10 wherein the different oxides comprise $Hf_xAl_yO_z$, where "z" is greater than zero, and "x" and "y" range from 0 to 1 with at least one of "x" and "y" being greater than zero.

12. The device of claim 10 wherein the different oxides comprise $Ta_xNb_yO_z$, where "x" is greater than zero, and "x" and "y" range from 0 to 1 with at least one of "x" and "y" being greater than zero.

13. The device of claim 10 wherein the different oxides comprise $Hf_xSi_yO_z$, where "z" is greater than zero, and "x" and "y" range from 0 to 1 with at least one of "x" and "y" being greater than zero.

14. The device of claim 10 wherein the different oxides comprise $Ba_xSr_yTi_zO_3$, where "x", "y" and "z" range from 0 to 1 with at least one of "x", "y" and "z" being greater than zero.

15. The device of claim 10 wherein the different oxides comprise $ZrO_x$, where x ranges from 1 to 2.

16. The device of claim 1 wherein at least one of the pair of regions is characterized by an outermost lateral edge that is thicker than where said at least one of the pair of regions joins with the intermediate region.

17. The device of claim 1 wherein both of the pair of regions are characterized by an outermost lateral edge that is thicker than where said respective of the pair of regions individually join with the intermediate region.

18. The device of claim 1 wherein only one of the pair of regions is characterized by an outermost lateral edge that is thicker than where said at least one of the pair of region joins with the intermediate region.

19. The device of claim 1 wherein the three regions are characterized by only two different materials to have only two different dielectric constants k.

20. The device of claim 1 wherein the three regions are characterized by at least three different materials.

* * * * *

UNITED STATES PATENT AND TRADEMARK OFFICE
CERTIFICATE OF CORRECTION

PATENT NO. : 7,442,977 B2
APPLICATION NO. : 11/253461
DATED : October 28, 2008
INVENTOR(S) : Basceri et al.

It is certified that error appears in the above-identified patent and that said Letters Patent is hereby corrected as shown below:

On the title page, in item (56), under "U.S. Patent Documents", in column 1, line 3, delete "H000986" and insert -- H0000986 --, therefor.

In column 12, line 28, in Claim 12, after "where" delete ""x"" and insert -- "z" --, therefor.

Signed and Sealed this

Third Day of March, 2009

JOHN DOLL
*Acting Director of the United States Patent and Trademark Office*